(12) United States Patent
Klinger

(10) Patent No.: US 7,731,494 B2
(45) Date of Patent: Jun. 8, 2010

(54) SYSTEM FOR USE IN A VERTICAL FURNACE

(75) Inventor: Daniel L. Klinger, Cornelius, OR (US)

(73) Assignee: A.S.M. International N.V., Bilthoven (NL)

( * ) Notice: Subject to any disclaimer, the term of this patent is extended or adjusted under 35 U.S.C. 154(b) by 329 days.

(21) Appl. No.: 11/894,952

(22) Filed: Aug. 22, 2007

(65) Prior Publication Data

US 2009/0049754 A1    Feb. 26, 2009

(51) Int. Cl.
*F27D 1/18*    (2006.01)

(52) U.S. Cl. .................. 432/244; 432/242; 432/250; 49/475.1; 49/477.1

(58) Field of Classification Search .................. 432/239, 432/241, 242, 244, 250; 49/477.1, 475.1, 49/463

See application file for complete search history.

(56) References Cited

U.S. PATENT DOCUMENTS

| 5,207,573 | A | * | 5/1993 | Miyagi et al. ................ 432/182 |
| 5,902,406 | A | * | 5/1999 | Uchiyama et al. ............ 118/724 |
| 6,709,525 | B2 | * | 3/2004 | Song ........................... 118/733 |
| 6,988,886 | B2 | * | 1/2006 | Takata et al. ................. 432/242 |

* cited by examiner

*Primary Examiner*—Gregory A Wilson

(57) ABSTRACT

A system used in a vertical furnace is provided that includes a tube. The tube includes a tube flange at its lower end. The tube flange provides a first sealing surface at its lower end. Further, there is a structural member at the lower surface of the tube flange. This structural member extends vertically away from the lower surface of the tube flange at a position that is displaced inwardly from the first sealing surface. The system also includes a removable door plate that provides a second sealing surface at its upper surface. The second sealing surface of the removable door plate is sealed with the first sealing surface of the tube flange.

11 Claims, 6 Drawing Sheets

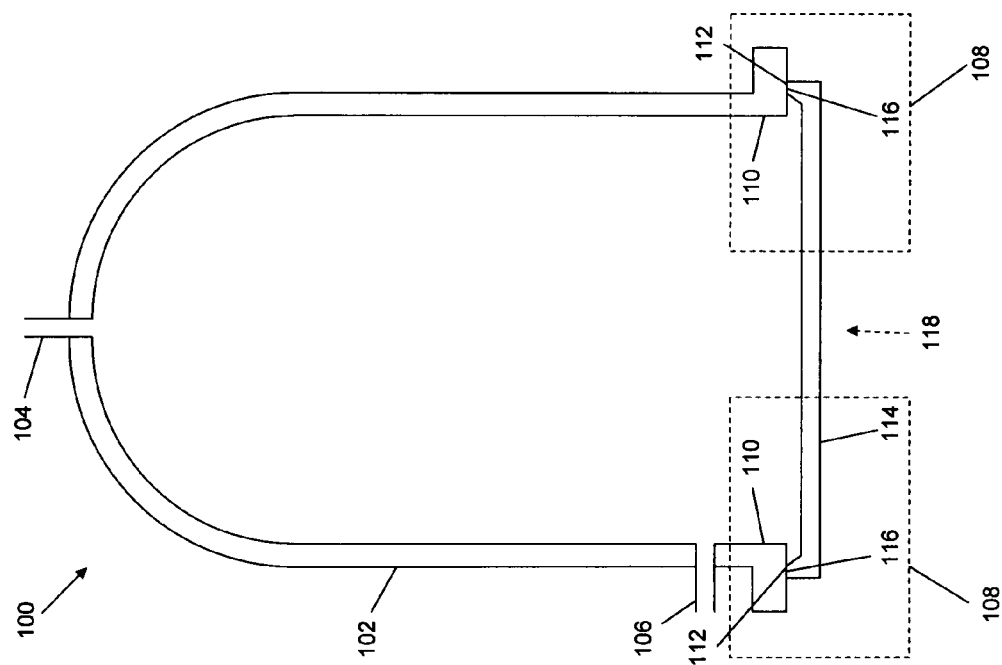
FIG. 1 – Prior Art

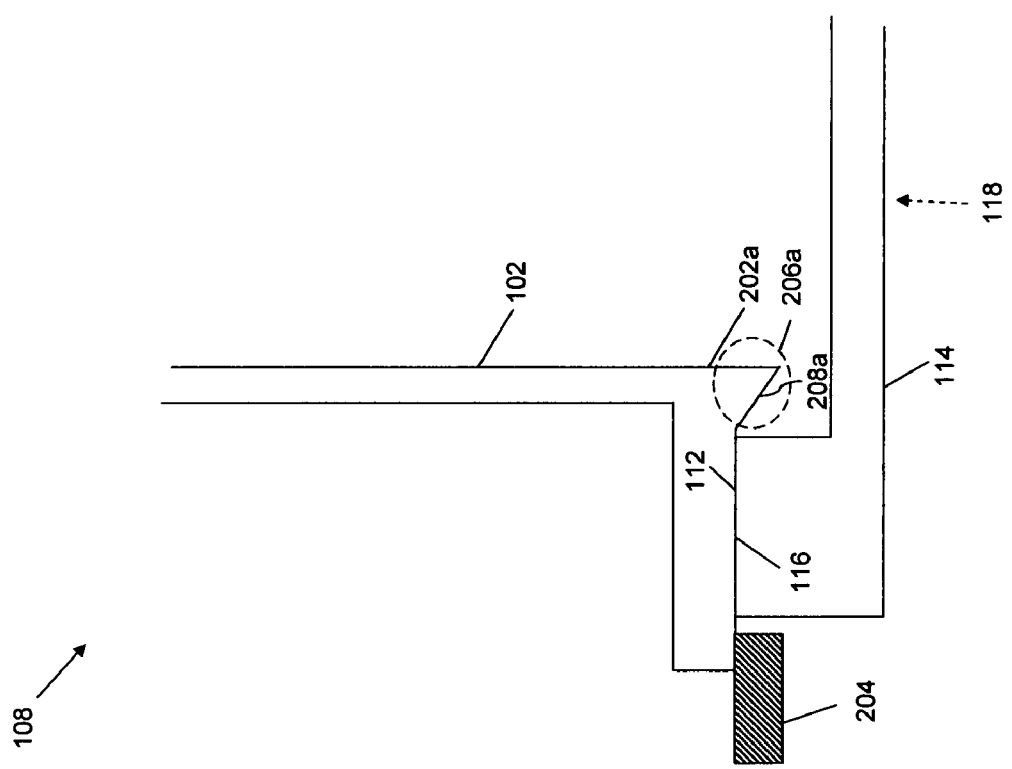

SYSTEM FOR USE IN A VERTICAL FURNACE

BACKGROUND

The present invention generally relates to the field of semiconductor manufacturing. More specifically, the present invention relates to a system used in a vertical furnace.

In the vertical furnace, a substantially cylindrical, vertically oriented process tube, made of ceramic material, is supported on a door plate. The process tube defines an opening that is closed by the door plate. In some processes, material may condense on the wall of the process tube. This material may be polyimide by-products that are formed during the annealing of polyimide films on the semiconductor substrate. The material condensed on the wall of the process tube runs downwards on to the sealing surface of the process tube and the door plate. This material is sticky and prevents the easy removal of the door plate from the closable opening.

The material on the sealing surface of the process tube and the door plate causes friction. When the door plate is separated from the process tube, the surfaces rub against each other resulting in the generation of particles. This causes damage to the door plate and the process tube. Replacing the door plate and the process tube is expensive and preventive maintenance at frequent intervals results in a reduction in production.

Accordingly, there is a need for a system that can be used in vertical furnaces for the easy removal of the door plate from the opening. Moreover, the system should prevent the door plate from sticking, to avoid damage to the door plate and the process tube.

SUMMARY

An object of the present invention is to provide a system that is used in a vertical furnace, which prevents the migration of condensed material to a sealing surface. This sealing surface is formed by a tube flange and a removable door plate.

Another object of the present invention is to provide a system for the easy separation of the removable door plate from the opening formed by the process tube.

Another object of the present invention is to provide a system that prevents the removable door plate and the process tube from getting damaged.

Yet another object of the present invention is to provide a system that increases the time interval between each preventive maintenance procedures.

To achieve the objects mentioned above, the present invention provides a system that is used in a vertical furnace. A tube flange is provided at the lower end of a tube. The tube flange provides a first sealing surface at its lower surface. Further, a structural member is provided at the lower surface of the tube flange. This structural member extends vertically away from the lower surface of the tube flange at a position that is displaced inwardly from the first sealing surface. The system also includes a removable door plate that provides a second sealing surface at its upper surface. In a closed position of the door plate, the second sealing surface of the removable door plate is sealed with the first sealing surface of the tube flange forming a mechanical seal.

BRIEF DESCRIPTION OF THE DRAWINGS

Various embodiments of the invention will hereinafter be described in conjunction with the appended drawings, provided to illustrate and not to limit the invention, wherein like designations denote like elements, and in which:

FIG. 1 is a diagram illustrating a furnace as existing in the prior art in which the present invention may be practiced;

FIG. 2a is a diagram illustrating a system that is used in a vertical furnace, in accordance with an embodiment of the present invention;

DETAILED DESCRIPTION OF THE INVENTION

Figure 2B:
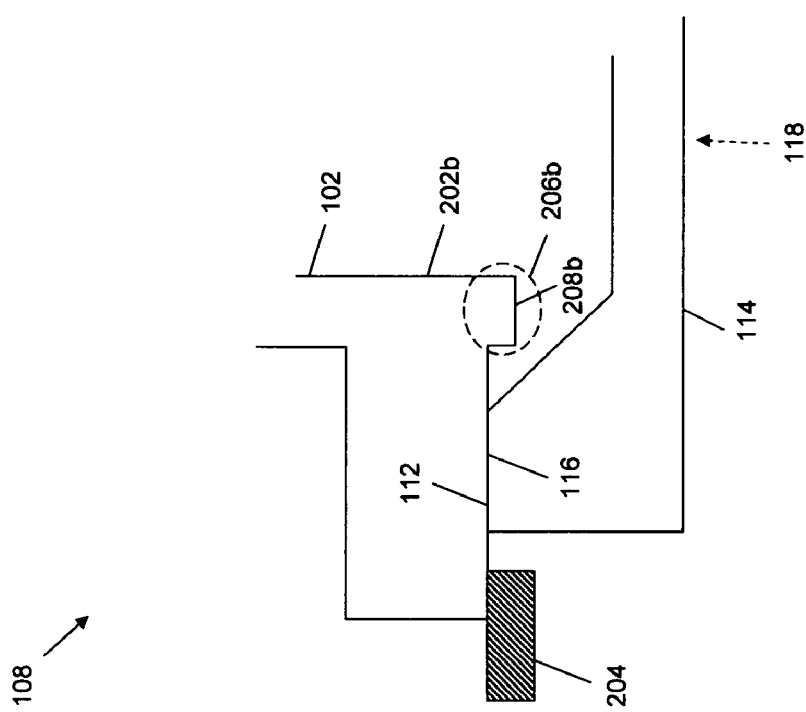
FIG. 2b is a diagram illustrating a system that is used in a vertical furnace, in accordance with another embodiment of the present invention.

The present invention provides a system that is used in a vertical furnace to prevent a door plate from sticking. The system enables the easy separation of the door plate from the opening formed by a process tube.

FIG. 1 is a diagram illustrating a furnace 100 as existing in the prior art in which the present invention may be practiced. Furnace 100 includes a process tube 102, a gas inlet 104, a gas exhaust 106, and a system 108 including a tube flange 110, a first sealing surface 112, a removable door plate 114, a second sealing surface 116, and an opening 118 at the bottom end of process tube 102. Process tube 102 encloses a reaction chamber. Process tube 102 is substantially a cylindrical tube that assumes a curved shape at the upper end of the reaction chamber. Process tube 102 and removable door plate 114 delimit the reaction chamber. Furnace 100 is heated by a heater, not shown in the figure, which is provided around process tube 102.

The gas is introduced into the top of the reaction chamber from gas inlet 104, and released from the bottom of the reaction chamber through gas exhaust 106. A substrate is processed at elevated temperatures in furnace 100 by passing process gases through process tube 102. The substrate, not shown in the figure, is placed inside process tube 102 through opening 118 at the bottom end of process tube 102. In the closed state, opening 118 is closed by removable door plate 114.

A substrate holder, not shown in the figure, accommodates a plurality of substrates in a vertically spaced arrangement. The substrate holder is placed inside process tube 102 for simultaneous processing of the plurality of substrates.

Process tube 102 is provided with tube flange 110 at one end. Tube flange 110 provides first sealing surface 112 at its lower surface. Removable door plate 114 provides second sealing surface 116 at its upper surface. In a closed state of door plate 114, second sealing surface 116 is sealed with first sealing surface 112. In the prior art, during processing of the substrates, material usually condenses on the inner wall of process tube 102, which is inside the reaction chamber. The condensed material migrates downwards on to the sealing formed by first sealing surface 112 and second sealing surface 116. The condensed material prevents the separation of removable door plate 114 from opening 118. Further, the material condensed on the sealing prevents a proper sealing of process tube 102 and removable door plate 114 in subsequent process runs. FIGS. 2a, 2b, 2c, 2d and 2e explain various embodiments of the present invention that prevent the migration of condensed material on to the sealing surface.

FIG. 2a is a diagram illustrating system 108 that is used in a vertical furnace, in accordance with an embodiment of the present invention. System 108 includes process tube 102, first sealing surface 112, removable door plate 114, second sealing surface 116, opening 118 at the bottom end of process tube 102, a tube flange 202a, a tube support surface 204, a structural member 206a, and a lower surface 208a of structural member 206a.

Process tube 102 has tube flange 202a at its lower end. Tube flange 202a supports process tube 102 and provides first sealing surface 112 at its lower surface. Removable door plate 114 provides second sealing surface 116 at its upper surface. Second sealing surface 116 of removable door plate 114 is configured to seal with first sealing surface 112 of tube flange 202a. Process tube 102 defines opening 118 at its lower end. In the closed state, opening 118 is closed by removable door plate 114. Second sealing surface 116 of door plate 114 is sealed with first sealing surface 112 of tube flange 202a to close and seal opening 118.

Tube support surface 204 supports tube flange 202a and is outwardly displaced from first sealing surface 112.

Tube flange 202a has structural member 206a at its lower surface. This structural member 206a extends vertically away from the lower surface of tube flange 202a and is at a position that is inwardly displaced toward the reaction chamber from first sealing surface 112. In this embodiment of the invention, structural member 206a is a projection that is displaced downwardly from first sealing surface 112 of tube flange 202a, as shown in FIG. 2a. Lower surface 208a of structural member 206a is at an angle to first sealing surface 112 of tube flange 202a.

Structural member 206a continues along the circumference of tube flange 202a, to prevent the flow of condensed material toward first sealing surface 112. That is, the flow of condensed material toward first sealing surface 112 is blocked by the projection on the lower surface of tube flange 202a. In operation, the condensed material migrates downward along the inner wall of process tube 102, which is inside the reaction chamber, until it reaches lower surface 208a of structural member 206a. The condensed material then drips and collects on removable door plate 114, which acts as a reservoir to collect the dripping condensed material from process tube 102.

FIG. 2b is a diagram illustrating system 108 that is used in a vertical furnace, in accordance with another embodiment of the present invention. System 108 includes process tube 102, first sealing surface 112, door plate 114, second sealing surface 116, opening 118 at the bottom end of process tube 102, a tube flange 202b, tube support surface 204, a structural member 206b, and a lower surface 208b of structural member 206b. In this embodiment of the invention, structural member 206b in tube flange 202b is a projection, as shown in FIG. 2b. Lower surface 208b of structural member 206b is parallel to first sealing surface 112 of tube flange 202b. Also, lower surface 208b of structural member 206b is at a position lower than first sealing surface 112. Structural member 206b continues along the circumference of tube flange 202b to prevent the flow of condensed material toward first sealing surface 114.

Figure 2C:
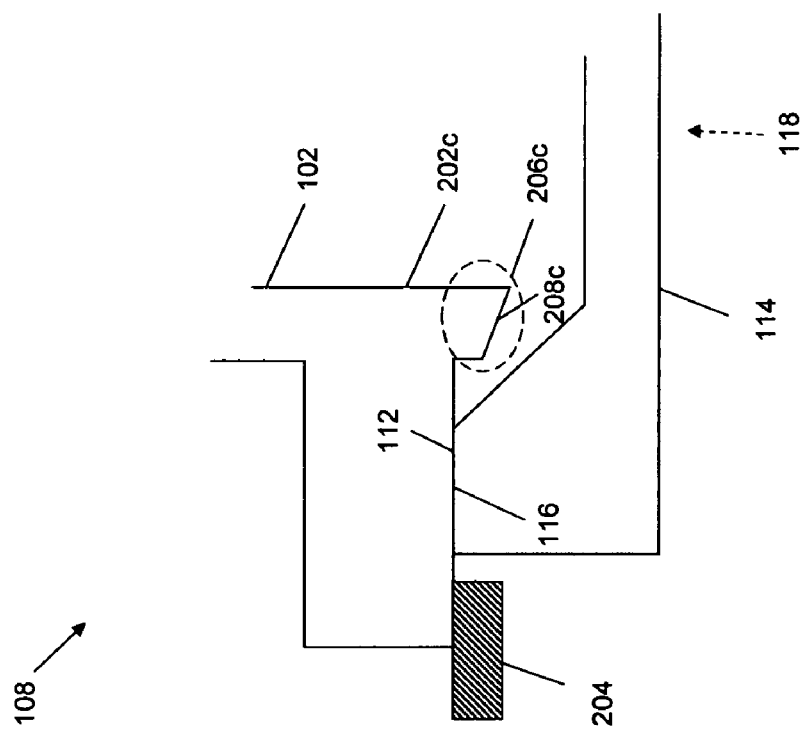
FIG. 2c is a diagram illustrating a system that is used in a vertical furnace, in accordance with yet another embodiment of the present invention.

FIG. 2c is a diagram illustrating system 108 that is used in a vertical furnace, in accordance with another embodiment of the present invention. System 108 includes process tube 102, first sealing surface 112, door plate 114, second sealing surface 116, opening 118 at the bottom end of process tube 102, a tube flange 202c, tube support surface 204, a structural member 206c, and a lower surface 208c of structural member 206c. In this embodiment of the invention, structural member 206c in tube flange 202c is a projection, as shown in FIG. 2c. Structural member 206c extends perpendicularly to first sealing surface 112 of tube flange 202c. Lower surface 208c of structural member 206c is at an angle to first sealing surface 112 of tube flange 202c. Also, lower surface 208c of structural member 206c is at a position lower than first sealing surface 112. Structural member 206c continues along the circumference of tube flange 202c to prevent the flow of condensed material toward first sealing surface 112.

Figure 2D:
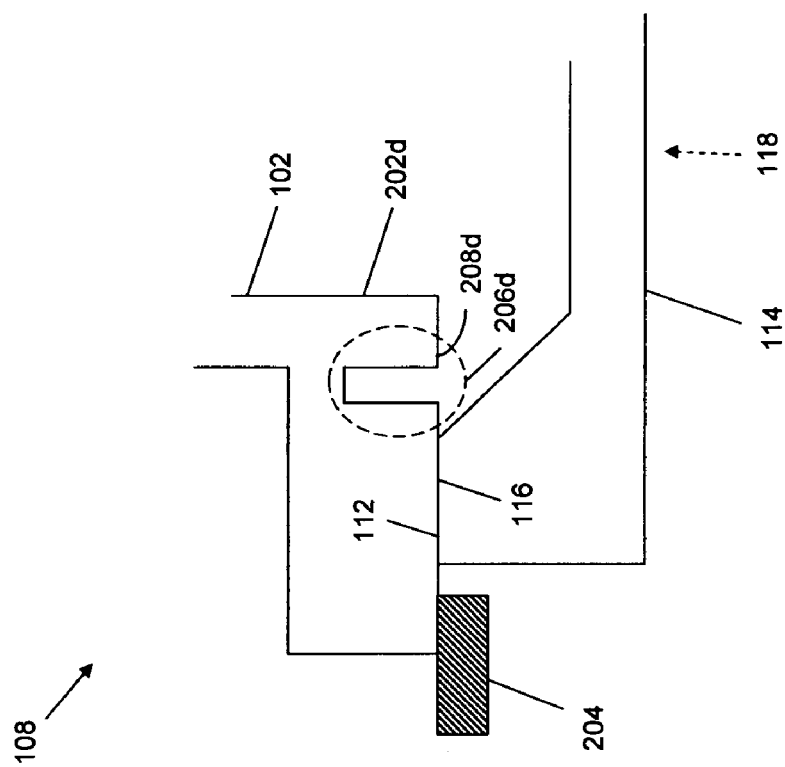
FIG. 2d is a diagram illustrating a system that is used in a vertical furnace, in accordance with a still further embodiment of the present invention.

FIG. 2d is a diagram illustrating system 108 that is used in a vertical furnace, in accordance with yet another embodiment of the present invention. System 108 includes process tube 102, first sealing surface 112, door plate 114, second sealing surface 116, opening 118 at the bottom end of process tube 102, a tube flange 202d, tube support surface 204, a structural member 206d, and a lower surface 208d of structural member 206d. In this embodiment of the invention, structural member 206d in tube flange 202d is a groove that extends upwardly from first sealing surface 112 of tube flange 202d, as shown in FIG. 2d. This groove is positioned between the inner edge of tube flange 202d and first sealing surface 112. The inner edge of tube flange 202d is inside the reaction chamber. The groove continues along the circumference of tube flange 202d to prevent the flow of condensed material toward first sealing surface 112. The migration of condensed material toward first sealing surface 112 is blocked by the groove on lower surface 208d. In operation, the condensed material migrates downward along the inner wall of process tube 102, which is inside the reaction chamber, until it reaches lower surface 208d of structural member 206d. The condensed material cannot migrate towards first sealing surface 112 because of the presence of the groove in tube flange 202d. The condensed material drips and collects on removable door plate 114, which acts as a reservoir to collect the dripping condensed material from process tube 102.

Figure 2E:
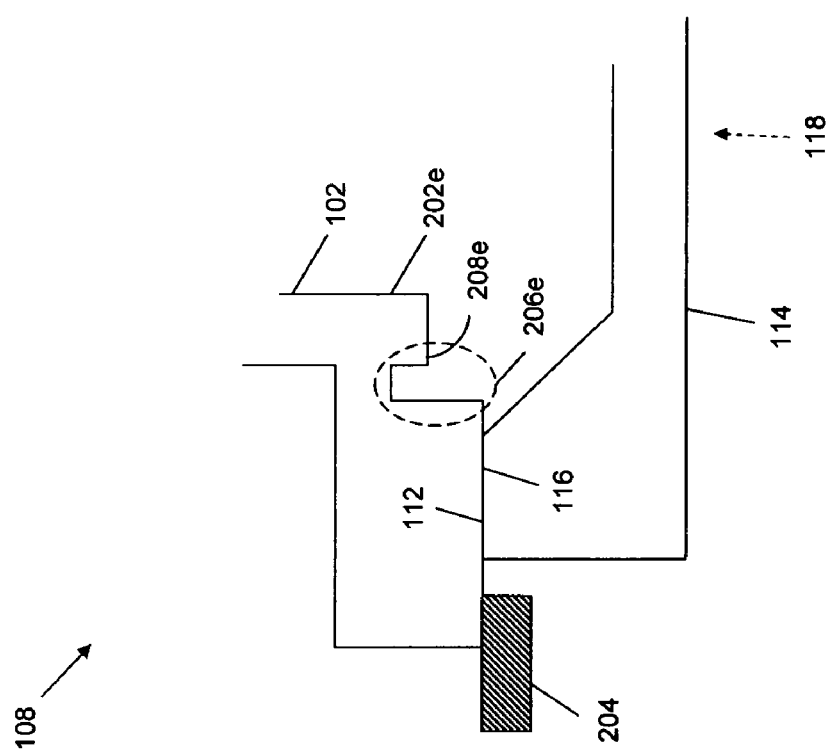
FIG. 2e is a diagram illustrating a system that is used in a vertical furnace, in accordance with an additional embodiment of the present invention.

FIG. 2e is a diagram illustrating system 108 that is used in a vertical furnace, in accordance with a still further embodiment of the present invention. System 108 includes process tube 102, first sealing surface 112, door plate 114, second sealing surface 116, opening 118 at the bottom end of process tube 102, a tube flange 202e, tube support surface 204, a structural member 206e, and a lower surface 208e of structural member 206e. In this embodiment of the invention, structural member 206e in tube flange 202e is a groove, as shown in FIG. 2e. This groove is positioned between the inner edge of tube flange 202e and first sealing surface 112. Further, lower surface 208e of the inner edge of tube flange 202e is upwardly displaced from first sealing surface 112 of tube flange 202e.

The groove continues along the circumference of tube flange 202e to prevent the flow of condensed material toward the sealing surface formed by first sealing surface 112 and second sealing surface 116. That is, the flow of condensed material toward first sealing surface 112 is blocked by the groove on lower surface 208e of tube flange 202e. In operation, the condensed material migrates downward along the inner wall of process tube 102, which is inside the reaction chamber, until it reaches lower surface 208e of structural member 206e. The condensed material then drips and collects on removable door plate 114, which acts as a reservoir to collect the dripping condensed material from process tube 102.

In embodiments of the present invention, shown in the drawings, process tube 102 is preferably made of quartz. In an embodiment of the present invention, removable door plate 114 is made of quartz. Depending on the process requirements and processing temperatures, any high-temperature material or combination of high-temperature materials can be selected, including but not limited to, materials comprising quartz, silicon, silicon carbide or aluminum oxide for the process tube and the door plate.

In various embodiments of the present invention, an O-ring may be used to seal first sealing surface 112 of tube flange 202 with second sealing surface 116 of removable door plate 114.

The system of the present invention provides many advantages. The system prevents the migration of condensed material to the sealing surface formed by the tube flange and the removable door plate. The system also enables the easy removal of the removable door plate from the closable opening by preventing flow of condensed material towards the sealing surface. Further, the system prevents damage to the removable door plate and the process tube.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A system for use in a vertical furnace, the system comprising:
    a. a tube, the tube comprising a tube flange at its lower end, the tube flange having at its lower surface:
        i. a first sealing surface; and
        ii. a groove positioned between an inner edge of the tube flange and the first sealing surface, the groove extending vertically away from the lower surface of the tube flange at a position displaced inwardly from the first sealing surface; and
    b. a removable door plate, the removable door plate provided with a second sealing surface at its upper surface, wherein the second sealing surface of the removable door plate is sealed with the first sealing surface of the tube flange.

2. The system of claim 1, wherein the tube is made of a material selected from the group consisting of quartz, silicon carbide, silicon, and aluminum oxide.

3. The system of claim 1, wherein the lower surface of the tube flange comprises a tube support surface outwardly displaced from the first sealing surface.

4. The system of claim 1, wherein the groove extends continuously along the circumference of the tube flange.

5. The system of claim 1, wherein the tube defines an opening at the lower end.

6. The system of claim 5, wherein the removable door plate is positioned in a closing state to close the opening defined by the tube.

7. The system of claim 1, wherein the removable door plate is made of a material comprising quartz.

8. A system for use in a vertical furnace, the system comprising:
    a. a tube, the tube comprising a tube flange at its lower end, the tube flange having at its lower surface a first circumferential sealing surface, and at least one of:
        i. a circumferential groove positioned between an inner edge of the tube flange and the first sealing surface; and
        ii. a circumferential projection inwardly displaced from the first sealing surface; and
    b. a removable door plate, the removable door plate provided with a second sealing surface at its upper surface, wherein the second sealing surface of the removable door plate is sealed with the first sealing surface of the tube flange.

9. The system of claim 8, wherein the lower surface of the tube flange comprises a tube support surface outwardly displaced from the first sealing surface.

10. The system of claim 8, wherein the tube is made of a material selected from the group consisting of quartz, silicon carbide, silicon, and aluminum oxide.

11. The system of claim 8, wherein the removable door plate is made of a material comprising quartz.

\* \* \* \* \*